United States Patent [19]

Peier et al.

[11] Patent Number: 5,559,442
[45] Date of Patent: Sep. 24, 1996

[54] PROCESS AND SENSOR FOR MEASURING ELECTRIC VOLTAGES AND/OR ELECTRIC FIELD INTENSITIES

[75] Inventors: Dirk Peier, Dortmund; Holger Hirsch, Bönen, both of Germany

[73] Assignee: MWB High Voltage Systems GmbH, Bamberg, Germany

[21] Appl. No.: 294,029

[22] Filed: Aug. 24, 1994

[51] Int. Cl.⁶ .......................... G01R 19/00; G01R 23/16
[52] U.S. Cl. .............................................. 324/753; 324/96
[58] Field of Search ........................... 324/96, 753, 750, 324/765, 71.1, 458.1, 73.1; 359/246, 248, 295, 260, 265; 356/400, 368, 364; 250/227.01, 231.1, 227.14

[56] References Cited

U.S. PATENT DOCUMENTS

| | | | |
|---|---|---|---|
| 4,755,036 | 7/1988 | Suzuki et al. | 385/8 |
| 5,012,183 | 4/1991 | Kawano et al. | 324/96 |
| 5,113,131 | 5/1992 | Cooper et al. | 324/96 |

*Primary Examiner*—Vinh P. Nguyen
*Attorney, Agent, or Firm*—Barnes & Thornburg

[57] ABSTRACT

A process for measuring electric voltages and/or electric fields by the use of a crystal with an electro-optical (Pockels) effect. To this end, in a direction transverse to the direction of propagation (y direction) of a light wave polarized in the z direction, an electric field intensity gradient is generated in the crystal in the direction from which results a corresponding gradient in the refractive index n of the crystal. This produces a deflection of the light wave in the crystal which depends upon the field intensity and on emergence, it is used as a measure for the voltage of field intensity. A suitable sensor for this purpose is also described.

11 Claims, 2 Drawing Sheets

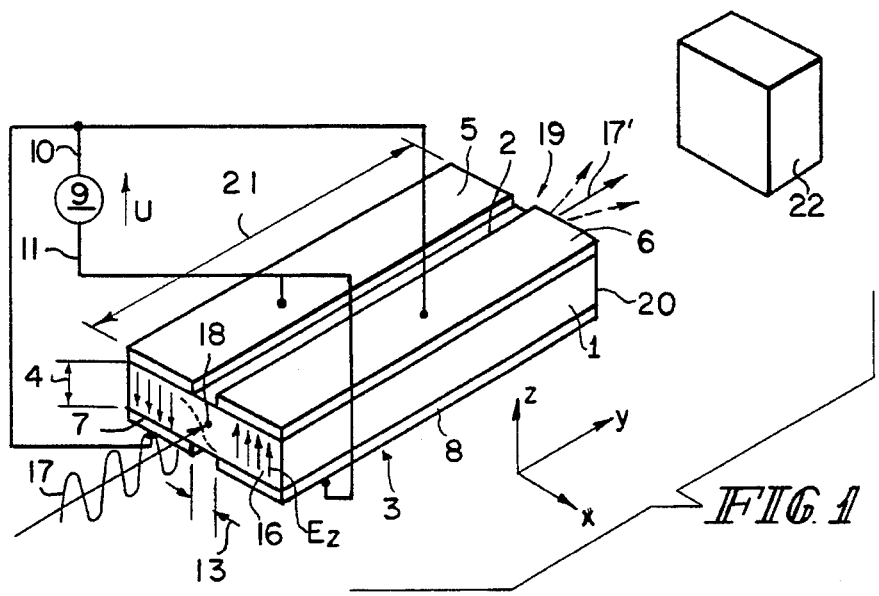
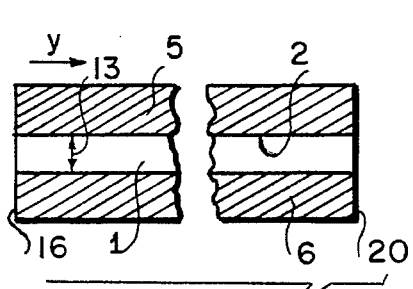
FIG. 2
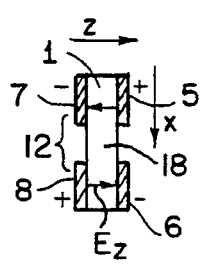
FIG. 3
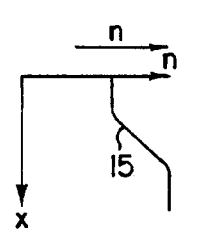
FIG. 4
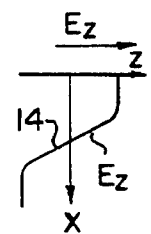
FIG. 5
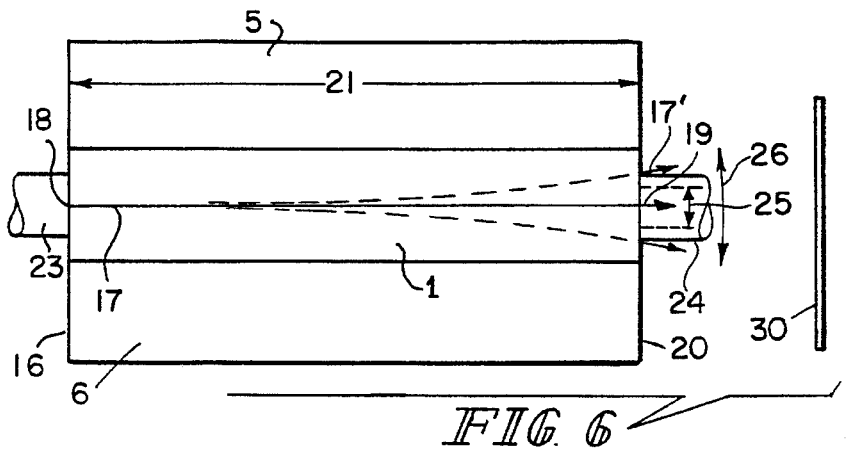
FIG. 6

PROCESS AND SENSOR FOR MEASURING ELECTRIC VOLTAGES AND/OR ELECTRIC FIELD INTENSITIES

BACKGROUND AND SUMMARY OF THE INVENTION

The present invention relates generally to a process for measuring electric voltages and/or electric field intensities and more specifically to a sensor for carrying out this measuring process.

Known processes and correspondingly used sensors of this type are based on the principle of the linear electro-optical effect of various crystals.

Measuring processes and sensors for such processes are known which are based on the principle that the refractive index of certain crystals, which are transparent for light waves, can be changed as a function of an electric field intensity generated in the crystal. Crystals made of lithium niobate or potassium dihydrophosphate, for example, have this so-called electro-optical effect. Two electrodes are arranged on a surface of a crystal wafer in parallel and at a distance from one another, for example, for measuring an applied voltage, by the resulting change of the refractive index which is a function of the applied voltage.

For determining the refractive indices, interferometric arrangements or polarimetric arrangements are known. In the interferometric arrangement or process, the phase of a light wave is modulated and superimposed on a reference wave which leads to an intensity change of the coupled-out light wave. In the case of the polarimetric arrangement or process, the polarization of a polarized light wave is changed as a function of the refractive index and the intensity change is determined by a polarizer.

Both known arrangements require relative high technical expenditures. In addition, the materials to be used cause implementation problems. In addition to occurrence and the requirement of high electro-optical effects of the materials, there occurs in these materials, piezo-electric as well as elasto-optical effect which together have the same appearance as the purely electro-optical effect. The inertia of the material will then have the result that, in the area of low frequencies, the electro-optical effect, on the one hand, and the piezo-electric effect and elasto-optical effect, on the other hand, are superimposed on one another. The transition range is also characterized by resonance phenomena which result from crystal oscillations.

Therefore, for a broad-band measuring system, the exclusive utilization of the purely electro-optical effect is required; that is, the corresponding piezo-electric/elasto-optical effects must be negligible.

In the case of the polarimetric arrangement, this situation must be met simultaneously for two coefficients, while, in the case of an interferometric arrangement, one coefficient will be sufficient. Therefore, a much larger number of materials are available for the construction of a broad-band interferometric measuring system than for a broad-band polarimetric measuring system. However, a disadvantage are the considerable technological expenditures of an interferometer. In addition, integrated-optical components must be used for this purpose, to which optical power must be fed by a defined mode and by a defined polarization. During the use of this technology in practice, the use of a polarization-maintaining optical wave guide (HiBi-fiber) is therefore absolutely necessary.

An object of the present invention is to provide a process and a sensor for implementing this process by which the advantages of the interferometric process can basically be maintained, specifically the necessity of the evaluation of only a single electro-optical coefficient. In addition, the technical expenditures are to be minimized by the fact that neither an integrated-optical technology is to be used, nor must a special optical wave guide be applied.

The invention is particularly distinguished by the fact that the light wave must only be sent through the crystal, and must therefore be coupled in and coupled out. The deflection of the light wave to be coupled out or of the coupled-out light wave can be determined and evaluated by simple devices.

Further advantageous details of the invention are found in the subclaims and will be explained in detail in the following by means of the embodiment illustrated in the drawing.

Other objects, advantages and novel features of the present invention will become apparent from the following detailed description of the invention when considered in conjunction with the accompanying drawings.

BRIEF DESCRIPTION OF THE DRAWINGS

FIG. 1 is a perspective view of a crystal to which voltage is applied according to the invention.

FIG. 2 is a top view of the crystal according to FIG. 1.

FIG. 3 is a view of the face of the crystal according to FIG. 1.

FIG. 4 is a graph of the refractive index n in the x-direction.

FIG. 5 is a graph of the field intensity $E_z$ in the x-direction.

FIG. 6 is a plan view of the possible course of a deflected light wave.

DESCRIPTION OF THE PREFERRED EMBODIMENTS

Figure 7:
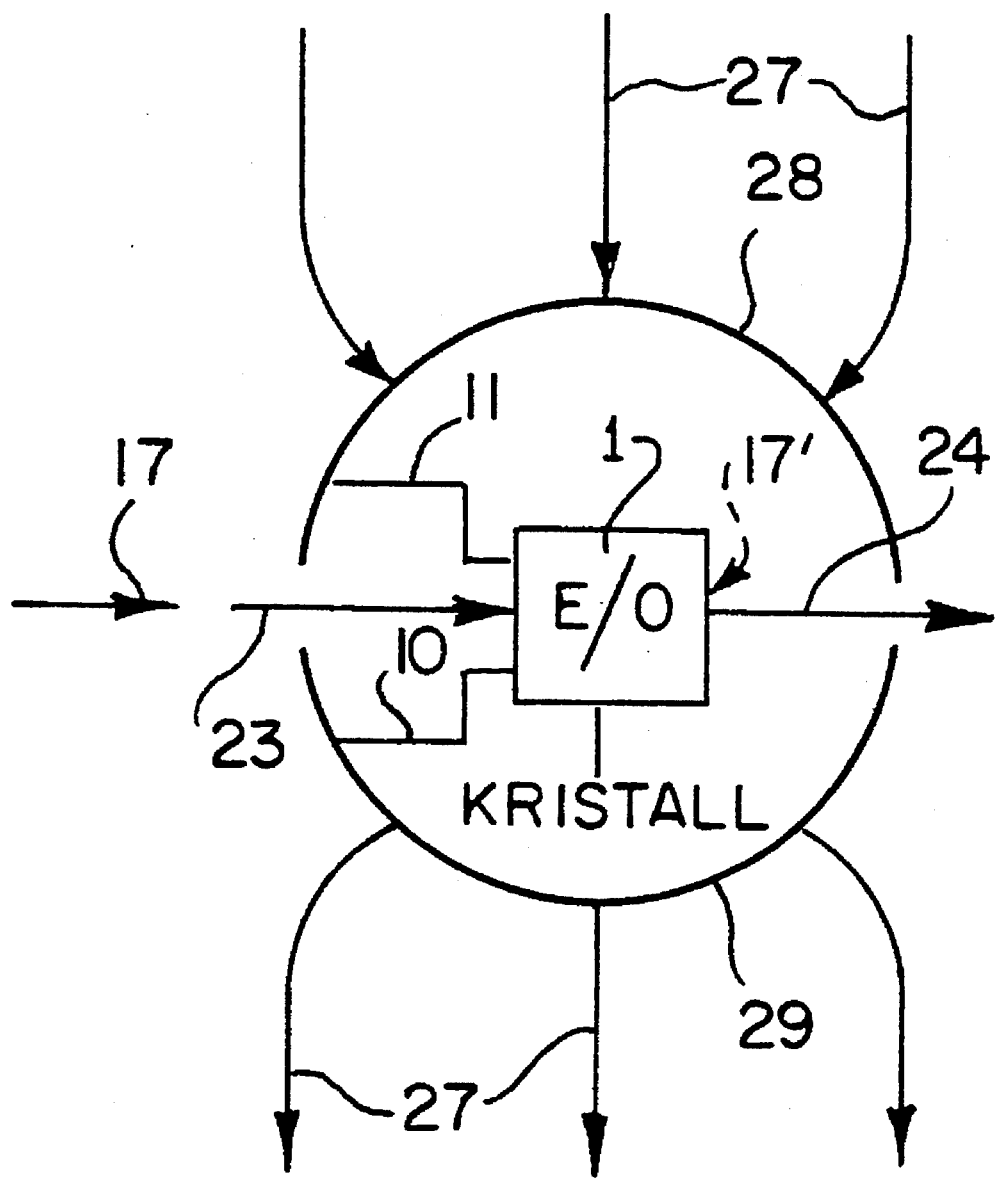
FIG. 7 is a view of the arrangement of a sensor between two spherical half shells provided in an electric field.

In FIG. 1, reference number 1 indicates a crystal made, for example, of lithium niobate. Its two surfaces—top surface 2 and bottom surface 3—extend in the direction of the x- and y-axes and its thickness 4 extends in the direction of the z-axis of the crystal 1, as illustrated by the coordinates. In the following, the coordinate data of the x-, y- and z-direction will always refer to the crystal axes. The two surfaces 2 and 3 are each provided with a pair of strip-shaped electrodes 5, 6 and 7, 8 extending in the y-direction. In this case, one pair of electrodes 5, 6 is opposite the other pair 7, 8 of electrodes in a congruent manner. Both pairs of electrodes 5, 6 and 7, 8 are connected to a voltage source 9 so that the diagonally mutually opposite electrodes 5, 8 and 6, 7 respectively are jointly connected with one of the poles 10 and 11 of the voltage source 9. As a result, an electric field $E_z$ in the z-direction is formed between the electrodes 5 and 7, on the one side, and the electrodes 6 and 8, on the other side; however, these electric fields $E_z$ are directed against one another corresponding to the connection to the voltage source 9. Because of the definition of the linear electro-optical effect, therefore, for example, the refractive index n of the crystal 1 is increased in one field and is reduced in the other field (so-called Pockels Effect).

Correspondingly, a continuously changing field intensity with defined field intensity gradients 14 as shown in FIG. 5, develops in the x-direction, in the area 12. As a rule, area 12 is slightly larger than the distance 13 between the mutually parallel electrodes 5, 6 and 7, 8 in each case in a surface 2 or 3. The refractive coefficient n in the x-direction will therefore also change and a corresponding gradient 15 is obtained, as illustrated in FIG. 4.

One of the faces 16, perpendicular to the y-direction, is used for the coupling-in of a light wave 17 polarized in the z-direction. In the embodiment, the coupling-in point 18 was selected in the center of the face 16. The coupling-out point 19 may be provided correspondingly on the opposed face 20. According to the desired measuring result, these coupling-in and coupling-out points 18, 19 may, however, also be selected or provided at other points of the crystal 1.

By means of the above-mentioned arrangement, a voltage or field measurement may be carried out as follows:

During the propagation of the light wave 17, which is polarized in the z-direction, into the positive y-direction of the crystal 1, the refractive index n appears with the one electro-optical coefficient $r_{33}$ (sole coefficient of lithium niobate which is frequency-independent in good approximation):

$$n=n_e-\tfrac{1}{2}\, n_e^3 r_{33} E_z \qquad (1)$$

wherein $n_e=2,200$ is the extraordinary refractive index and $E_z$ is the outer electric field along the z-direction of the crystal.

When the field intensity component $E_z$ changes along the coordinate x, the refractive index is also a function of the location. The light propagation of the beamed in light wave in the y-direction can then be described by the eikonal equation:

$$|grad\ \Phi(x)|^2 = n(x)^2 \qquad (2)$$

within $\Phi$ (x) is the phase function of the optical wave. The light wave will therefore follow the beam equation $$d/ds(n(x)\cdot dr/ds) = grad\ n(x) \qquad (3)$$

with s is the path length along the light path or the beam propagation and r is the location vector. A possible deflection of the light wave 17 is illustrated in FIG. 6 by an interrupted and dash-dotted line.

From the solution of equation (3), the following is approximately obtained for the location function of the light beam $$x = 1/\alpha \cdot (\cos h(\alpha y) - 1) \qquad (4)$$

$$\alpha = -\tfrac{1}{2}\, n_e^2 r_{33}\, dE_z(x)/dx \qquad (5)$$

Small deflection angles φ, while taking into account the calculation at the emergence of the light wave 17' from the crystal 1 with the beamed-through light path 21 and the length L, can be estimated to be:

$$\phi = -\tfrac{1}{2}\, n_e^3 r_{33}\, dE_z(x)/dx\, L \qquad (6)$$

As a result of equation (6), it becomes clear that for the electro-optical deflection of the light wave 17, the gradient of the field intensity $E_z$ is relevant. Such a field intensity graph can be implemented by the described four-electrode arrangement.

By the appropriate coupling-in and coupling-out of the light wave 17, for example, an intensity-modulated optical signal can be obtained on an analysis unit 22 corresponding to the time-related graph of the field intensity, which signal corresponds to the voltage fed to the electrodes 5, 6 and 7, 8 or to a corresponding field intensity providing voltage fed to the electrodes.

As illustrated in FIG. 6, the coupling-in of the light wave 17 may take place via a suitable optical wave guide 23 which is coupled to the face 16, and the coupling-out may take place via an optical wave guide 24 coupled to the face 20. Preferably, the core or the core diameter 25 of the optical wave guide 24 provided on the coupling-out side is smaller than the possible deflection range 26. As a result, in the case of the shown centered arrangement of the optical wave guide 24 with respect to the optical wave guide 23, the deflection can be recognized by an intensity change of the light output beamed into the optical wave guide 24.

For the measuring of an electric field, according to FIG. 7, an arrangement consisting of two potential surfaces 28 and 29 may be mounted in field 27 with the crystal 1 there between. The potential surfaces 28 and 29 are made of a material which is electrically conductive at least on one side and which are constructed as spherical half shells in the embodiment. Instead of being connected to a voltage source 9, the electrodes are connected with the potential surfaces 28, 29. In the case of the existing electric field 27, an electric voltage is induced on the potential surfaces 28, 29 which represents a measurement for the field intensity existing there and can be measured. In the case of this measuring arrangement and measuring method, the sensor is therefore not connected to an external voltage or voltage supply so that the otherwise resulting field distortions can no longer occur.

The evaluation of the deflection of the coupled-out light wave 17' or the light wave 17' to be coupled out advantageously takes place via a photo diode or via a diode line or via other photo elements, possibly a screen 30, as illustrated in FIG. 6.

The process according to the invention and the sensor according to the invention which is used in this process may be used for direct current or for low- and high-frequency voltages or for corresponding d.c. fields or alternating fields.

As indicated in the description of FIG. 1, the process according to the invention and the sensor for carrying out this process will also be completely operable if the crystal axes x and y are rotated by 90° with respect to the representation in FIG. 1.

We claim:

1. A process for measuring electric voltages and electric field intensities using the electro-optical effect occurring in a crystal in which the field intensity in the crystal and thus the refractive index of the crystal along a light path along a y axis of the crystal can be changed by a voltage applied across a z axis of the crystal transverse to the light path, comprising:

positioning one or more pairs of electrodes on the crystal along the light path, the electrodes of each pair being on opposed surfaces of the crystal spaced along the z axis;

connecting an electric voltage to be measured to the electrodes such that a gradient of the electric field intensity in the z axis occurs along an x axis of the crystal and thus a gradient of the refractive index and, as a result, light wave in the crystal is deflected along the x axis as a function of the voltage to be measured;

transmitting a light wave along said light path;

measuring deflection of the light wave; and determining the electric voltage connected to the electrodes from said measured deflection.

2. Process according to claim 1, wherein positioning said electrodes includes positioning two pairs of electrodes extending along the y axis of the crystal, the electrodes of a pair are spaced from each other along said z axis and the pairs of electrodes are spaced from each other along said x axis of the crystal to form a region along said y axis outside said electrode pairs; and including introducing said light wave in a face of said region.

3. Process according to claim 2, wherein connecting said electrical voltage to the electrodes includes connecting diametrically opposite electrodes to each other.

4. Process according to claim 1, including using a light wave which is polarized in the direction of the z axis of the crystal.

5. Process according to claim 1 including coupling the light wave in via an optical wave guide.

6. Process according to claim 5, including coupling the deflected light wave out of a face opposite the coupling-in face via an optical wave guide, said optical wave guide having a light-conducting core smaller than an anticipated deflection range of the light wave to be coupled out so that the deflection causes a change of the light intensity of the coupled-out light wave.

7. Process according to claim 1, wherein for the measuring of field intensity, including positioning two potential surfaces into an electric field to be measured at a distance from one another, so that said potential surfaces have an electric potential therebetween and with the crystal arranged between them and connecting the potential surfaces to said electrodes to apply said electric voltage to be measured.

8. Process according to claim 7, wherein said potential surfaces are selected from the group of spherical probes and hemispherical probes.

9. Sensor for carrying out the process for measuring electric voltages and electric field intensities using the electro-optical effect occurring in a crystal in which the field intensity in the crystal and thus the refractive index of the crystal along a light path along a y axis of the crystal can be changed by a voltage applied across a z axis of the crystal transverse to the light path, comprising:

a flat crystal having opposed surfaces extending in the direction of its x and y axis and whose thickness extends in the direction of its z axis;

two pairs of strip-shaped electrodes, with members of each pair arranged on the opposed surfaces in a mutually opposite manner, extending along the y axis and the pairs being spaced from each other long the x axis; and means connecting diametrically opposite electrodes of each pair to each other and to an electric voltage to be measured such that a gradient of the electric field intensity in the z axis occurs along an x axis of the crystal and thus a gradient of the refractive index and, as a result, light wave in the crystal is deflected along the x axis as a function of the voltage to be measured.

10. Sensor according to claim 9, wherein the crystal is made of lithium niobate.

11. Sensor according to claim 9, wherein said spaced electrodes define a region of the crystal along the y axis outside the electrodes and including means for coupling a light in said region.

* * * * *